(12) United States Patent
Chang et al.

(45) Date of Patent: Jul. 19, 2022
(10) Patent No.: US 11,392,036 B2

(54) PHOTORESIST AND METHOD

(71) Applicant: Taiwan Semiconductor Manufacturing Co., Ltd., Hsinchu (TW)

(72) Inventors: Liang-Yi Chang, Hsinchu (TW); Tai-Chun Huang, Hsinchu (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/896,674

(22) Filed: Jun. 9, 2020

(65) Prior Publication Data

US 2021/0240081 A1    Aug. 5, 2021

Related U.S. Application Data

(60) Provisional application No. 62/968,483, filed on Jan. 31, 2020.

(51) Int. Cl.
*G03F 7/09* (2006.01)
*H01L 21/027* (2006.01)
(Continued)

(52) U.S. Cl.
CPC .............. *G03F 7/094* (2013.01); *G03F 7/16* (2013.01); *G03F 7/2004* (2013.01); *G03F 7/26* (2013.01);
(Continued)

(58) Field of Classification Search
CPC .......... G03F 7/094; G03F 7/16; G03F 7/2004; G03F 7/26; G03F 7/091; G03F 7/11;
(Continued)

(56) References Cited

U.S. PATENT DOCUMENTS 8,764,995 B2    7/2014 Chang et al.
8,795,931 B2 *  8/2014 Ryu ......................... G03F 1/24
                                                          430/5
(Continued)

FOREIGN PATENT DOCUMENTS

TW    201725440 A    7/2017

*Primary Examiner* — Lan Vinh
(74) *Attorney, Agent, or Firm* — Slater Matsil, LLP

(57) ABSTRACT

Multi-layer photoresists, methods of forming the same, and methods of patterning a target layer using the same are disclosed. In an embodiment, a method includes depositing a reflective film stack over a target layer, the reflective film stack including alternating layers of a first material and a second material, the first material having a higher refractive index than the second material; depositing a photosensitive layer over the reflective film stack; patterning the photosensitive layer to form a first opening exposing the reflective film stack, patterning the photosensitive layer including exposing the photosensitive layer to a patterned energy source, the reflective film stack reflecting at least a portion of the patterned energy source to a backside of the photosensitive layer; patterning the reflective film stack through the first opening to form a second opening exposing the target layer; and patterning the target layer through the second opening.

20 Claims, 5 Drawing Sheets

(51) Int. Cl.
*H01L 21/311* (2006.01)
*G03F 7/26* (2006.01)
*G03F 7/16* (2006.01)
*G03F 7/20* (2006.01)
*H01L 21/3105* (2006.01)

(52) U.S. Cl.
CPC .... *H01L 21/0274* (2013.01); *H01L 21/31053* (2013.01); *H01L 21/31144* (2013.01)

(58) Field of Classification Search
CPC ........... H01L 21/0274; H01L 21/31053; H01L 21/31144; H01L 21/0276; H01L 21/31116
USPC ....... 438/692, 706, 714, 717, 719, 723, 725, 438/710, 712
See application file for complete search history.

(56) References Cited

U.S. PATENT DOCUMENTS

| | | | |
|---|---|---|---|
| 8,796,666 B1 | 8/2014 | Huang et al. | |
| 8,828,625 B2 | 9/2014 | Lu et al. | |
| 8,841,047 B2 | 9/2014 | Yu et al. | |
| 8,877,409 B2 | 11/2014 | Hsu et al. | |
| 9,012,132 B2 | 4/2015 | Chang | |
| 9,028,915 B2 | 5/2015 | Chang et al. | |
| 9,093,530 B2 | 7/2015 | Huang et al. | |
| 9,146,469 B2 | 9/2015 | Liu et al. | |
| 9,184,054 B1 | 11/2015 | Huang et al. | |
| 9,213,234 B2 | 12/2015 | Chang | |
| 9,223,220 B2 | 12/2015 | Chang | |
| 9,256,123 B2 | 2/2016 | Shih et al. | |
| 9,256,133 B2 | 2/2016 | Chang | |
| 9,529,268 B2 | 12/2016 | Chang et al. | |
| 9,536,759 B2 | 1/2017 | Yang et al. | |
| 9,548,303 B2 | 1/2017 | Lee et al. | |
| 10,018,904 B2 * | 7/2018 | Takai | G03F 1/22 |
| 2007/0127007 A1 * | 6/2007 | Cormont | B82Y 10/00 |
| | | | 355/403 |
| 2015/0198874 A1 | 7/2015 | Ikuta | |
| 2015/0364337 A1 | 12/2015 | Guha et al. | |
| 2016/0363866 A1 * | 12/2016 | Hatakeyama | G03F 7/168 |
| 2017/0045822 A1 * | 2/2017 | Xu | H01L 21/0273 |
| 2017/0336721 A1 * | 11/2017 | Suzuki | G03F 7/322 |
| 2019/0101817 A1 * | 4/2019 | Lin | G03F 1/54 |

* cited by examiner

PHOTORESIST AND METHOD

PRIORITY CLAIM AND CROSS-REFERENCE

This application claims the benefit of U.S. Provisional Application No. 62/968,483, filed on Jan. 31, 2020, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
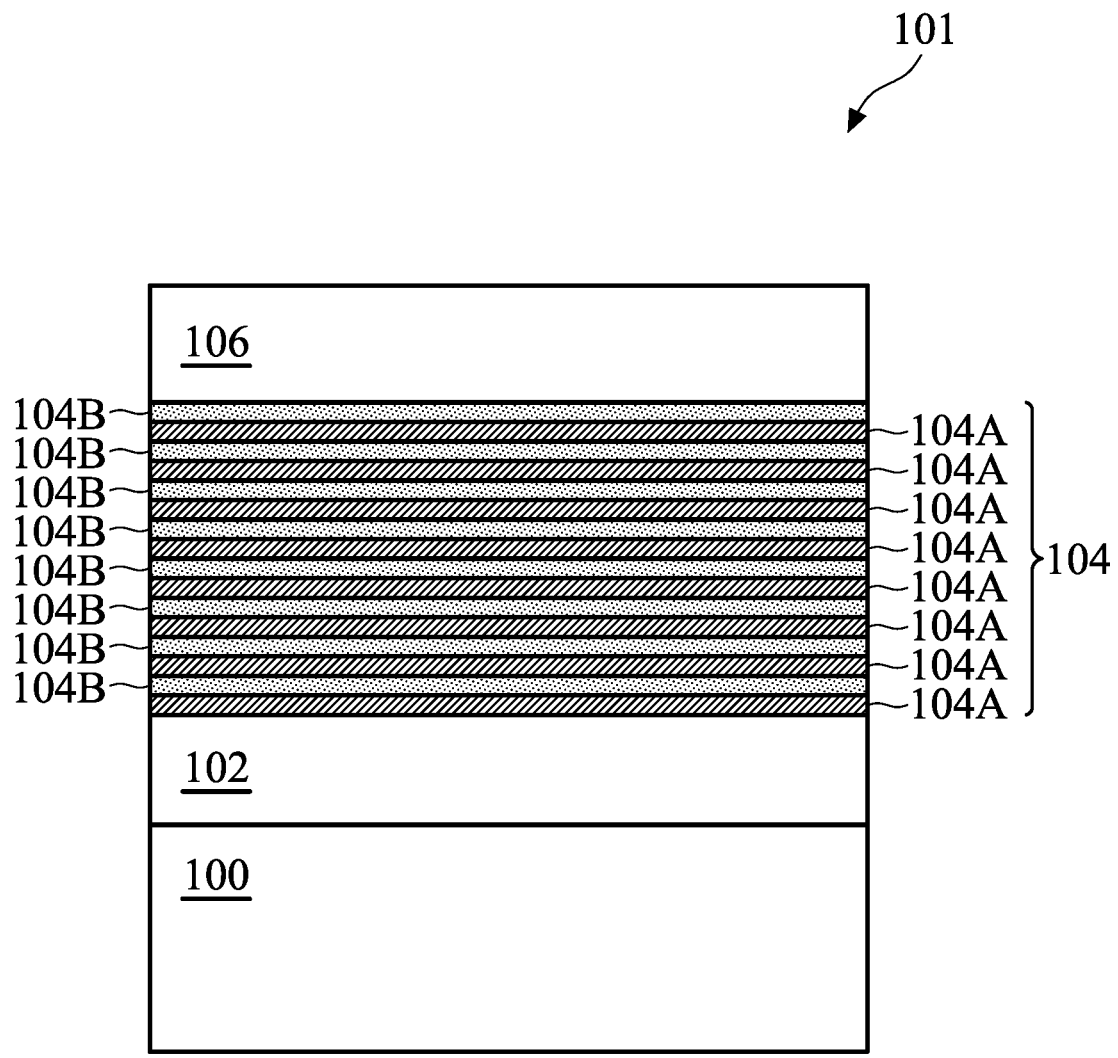
FIGS. 1 through 5 illustrate cross-sectional views of intermediary stages of manufacturing a semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide improved multi-layer photoresists, methods of forming the same, and methods of patterning target layers using the multi-layer photoresists. The multi-layer photoresists may include a reflective film stack and a photosensitive layer over the reflective film stack. The reflective film stack may be a multi-layer film stack which includes alternating first material films and second material films, which are formed of different materials. In some embodiments, the first material films may include high refractive index materials and the second material films may include low refractive index materials. For example, the first material films may include silicon (Si), beryllium (Be), or the like and the second material films may include molybdenum (Mo) or the like. Forming the reflective film stack under the photosensitive layer may allow for the photosensitive layer to be exposed using a lower energy dose with less exposure time. This reduces the energy and time required to expose the photosensitive layer, increasing throughput and reducing manufacturing costs and improves line-width and line-edge integrity, reducing device defects and increasing device performance.

FIGS. 1 through 5 illustrate cross-sectional views of intermediate stages in the formation of features in a target layer 102 in a semiconductor device 101, in accordance with some embodiments. In some embodiments, the semiconductor device 101 may be processed as part of a larger wafer. In such embodiments, after various features of the semiconductor device 101 are formed (e.g., active devices, interconnect structures, and the like), a singulation process may be applied to scribe line regions of the wafer in order to separate individual semiconductor dies from the wafer (also referred to as singulation).

As illustrated in FIG. 1, the target layer 102 may be formed over a semiconductor substrate 100. The semiconductor substrate 100 may be formed of a semiconductor material such as silicon, doped or undoped, or an active layer of a semiconductor-on-insulator (SOI) substrate. The semiconductor substrate 100 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; combinations thereof; or the like. Other substrates, such as multi-layered or gradient substrates, may also be used. Devices, such as transistors, diodes, capacitors, resistors, and the like, may be formed in and/or on an active surface of the semiconductor substrate 100. In other embodiments, where the target layer 102 is a semiconductor substrate used to form fin field-effect transistors (FinFETs), the semiconductor substrate 100 may be omitted.

The target layer 102 may be a layer in which a pattern is to be formed. In some embodiments, the target layer 102 may be a conductive layer, a dielectric layer, a semiconductor layer, or the like. In embodiments in which the target layer 102 is a conductive layer, the target layer may be a metal layer, a polysilicon layer, or the like. The target layer 102 may be deposited by physical vapor deposition (PVD), chemical vapor deposition (CVD) (e.g., blanket deposition or the like), or the like. The conductive layer may be patterned according to the processes described below to form metal gates (e.g., in a cut metal gate process), conductive lines, conductive vias, dummy gates (e.g. for replacement gates in FinFETs), or the like.

In embodiments in which the target layer 102 is a dielectric layer, the target layer 102 may be an inter-metal dielectric layer, an inter-layer dielectric layer, a passivation layer, or the like. The target layer 102 may be a material having a low dielectric constant (e.g., a low-k material). For example, the target layer 102 may have a dielectric constant lower than 3.8, lower than about 3.0, or lower than about 2.5. The target layer 102 may be a material having a high dielectric constant, such as a dielectric constant higher than 3.8. The target layer 102 may be deposited by chemical vapor deposition (CVD), atomic layer deposition (ALD), or the like. One or more openings (such as openings 110, discussed below with respect to FIG. 5) may be patterned in the target layer 102 according to the processes described below and conductive lines, conductive vias, or the like may be formed in the openings in the target layer 102.

In embodiments in which the target layer 102 is a semiconductor material, the target layer 102 may be formed of silicon, silicon germanium, or the like. In some embodiments, the target layer 102 may be formed of a crystalline semiconductor material such as crystalline silicon, crystalline silicon carbide, crystalline silicon germanium, a crystalline III-V compound, or the like. In some embodiments, openings (such as openings 110, discussed below with respect to FIG. 5) may be patterned in the target layer 102 according to the processes described below and shallow trench isolation (STI) regions may be formed in the openings in the target layer 102. Semiconductor fins may protrude from between neighboring STI regions and source/drain regions may be formed in the semiconductor fins. The semiconductor fins may include material of the target layer 102 remaining after forming the openings in the target layer 102. Gate dielectric layers and gate electrodes may be formed over channel regions in the semiconductor fins, thereby forming semiconductor devices such as fin field effect transistors (FinFETs).

Although FIG. 1 illustrates the target layer 102 as being in physical contact with the semiconductor substrate 100, any number of intervening layers may be disposed between the target layer 102 and the semiconductor substrate 100. Such intervening layers may include an inter-layer dielectric (ILD) layer, which may include a low-k dielectric and may include contact plugs formed therein, other inter-metallic dielectric (IMD) layers having conductive lines and/or vias formed therein, one or more intermediary layers (e.g., etch stop layers, adhesion layers, or the like), combinations thereof, and the like. For example, an optional etch stop layer may be disposed directly under the target layer 102. The etch stop layer may act as a stop for an etching process subsequently performed on the target layer 102 (e.g., the etching process described below with respect to FIG. 4). The materials and processes used to form the etch stop layer may depend on the material of the target layer 102. In some embodiments, the etch stop layer may be formed of silicon nitride, SiON, SiCON, SiC, SiOC, $SiC_xN_y$, $SiO_x$, other dielectrics, combinations thereof, or the like, and may be formed by chemical vapor deposition (CVD), atomic layer deposition (ALD), or the like.

A reflective film stack 104 is formed over the target layer 102. The reflective film stack 104 is a multi-layer film stack which includes alternating layers of high refractive index films 104A and low refractive index films 104B. The high refractive index films 104A and the low refractive index films 104B may be deposited by physical vapor deposition (PVD), chemical vapor deposition (CVD), atomic layer deposition (ALD), or the like. The high refractive index films 104A may be formed of high refractive index materials and the low refractive index films 104B may be formed of low refractive index materials. The high refractive index materials may have a refractive index ranging from about 0.94 to about 1.03 or from about 0.97 to about 1.00. The low refractive index materials may have a refractive index ranging from about 0.87 to about 1.00 or from about 0.90 to about 0.97. A ratio of the refractive index of the high refractive index materials to the refractive index of the low refractive index materials may be from about 1.00 to about 1.15 or from about 1.05 to about 1.10. The high refractive index materials may have a tendency to scatter incoming radiation (such as the radiation beam 108, discussed below with respect to FIG. 2), and the low refractive index materials may have a tendency to transmit incoming radiation. Including alternating layers of the high refractive index films 104A and the low refractive index films 104B provides reflectivity for the reflective film stack 104. Moreover, including refractive index materials having the prescribed refractive indexes improves the reflectivity of the reflective film stack 104 to incoming radiation in embodiments in which the incoming radiation includes extreme ultraviolet (EUV) radiation.

Various qualities of the reflective film stack 104 may be selected to increase the reflectivity of the reflective film stack 104 based on the wavelength of incoming radiation. For example, the materials and layer thicknesses of the high refractive index films 104A and the low refractive index films 104B, the number of pairs of the high refractive index films 104A and the low refractive index films 104B included in the reflective film stack 104, and the overall thickness of the reflective film stack 104 may be selected to increase the reflectivity of the reflective film stack 104, while keeping the thickness of the reflective film stack 104 to a minimum.

In embodiments in which the incoming radiation includes EUV radiation, the high refractive index materials may include silicon (Si), beryllium (Be), or the like. The low refractive index materials may include molybdenum (Mo) or the like. Each of the high refractive index films 104A may have a thickness from about 1 nm to about 6 nm or from about 3 nm to about 4 nm. Each of the low refractive index films 104B may have a thickness from about 1 nm to about 6 nm or from about 3 nm to about 4 nm. A ratio of thicknesses of the high refractive index films 104A to thicknesses of the low refractive index films 104B may be from about 1:2 to about 2:1 or from about 1:1 to about 3:2. The reflective film stack 104 may include from about 20 to about 80 pairs or from 35 to 45 pairs of the high refractive index films 104A and the low refractive index films 104B. A total thickness of the reflective film stack 104 may be from about 200 nm to about 450 nm or from about 280 nm to about 360 nm. Although the bottom layer of the reflective film stack 104 is illustrated as being a high refractive index film 104A and the top layer of the reflective film stack 104 is illustrated as being a low refractive index film 104B, both the top layer and the bottom layer of the reflective film stack 104 may be a high refractive index film 104A or a low refractive index film 104B.

The materials of the high refractive index films 104A and the low refractive index films 104B may also have low extinction coefficients such that absorption of incoming radiation by the reflective film stack 104 is minimized. For example, extinction coefficients of the high refractive index films 104A and the low refractive index films 104B may be less than about 0.10 or less than about 0.01.

A photosensitive layer 106 is deposited over the reflective film stack 104. The photosensitive layer 106 may be a photosensitive material and may be formed of an organic material, such as a polymer material. The photosensitive layer 106 may be deposited by spin-on processes, CVD, ALD, or the like. The photosensitive layer 106 may have a thickness from about 10 nm to about 80 nm or from about 20 nm to about 60 nm. The photosensitive material may be a positive photosensitive material (e.g., a material in which portions exposed to energy are removed by a developer) or a negative photosensitive material (e.g., a material in which portions that are not exposed to energy are removed by a developer).

In some embodiments, adhesion between the photosensitive layer 106 and the reflective film stack 104 may be improved by exposing the reflective film stack to an adhesion promoter such as hexamethyldisilazane (HMDS, [$(CH_3)_3Si]_2NH$) or the like. For example, in some embodiments, the reflective film stack 104 may be exposed to gaseous HMDS, which may cause the surface of the reflective film stack 104 to become silylated. This results in the surface of the reflective film stack being more hydrophobic, which improves adhesion of the photosensitive layer 106 to the reflective film stack 104.

In some embodiments, a planarity layer may be disposed between the target layer 102 and the reflective film stack 104. The planarity layer may be used to planarize the target layer 102, as top surfaces of the target layer 102 may be uneven. The planarity layer may be deposited by spin-on processes or the like. In some embodiments, the planarity layer may be deposited by a conformal process, such as spin-coating, chemical vapor deposition (CVD), atomic layer deposition (ALD), or the like and the planarity layer may be subsequently planarized using a process such as chemical mechanical planarization (CMP). The planarity layer may have a thickness from about 50 nm to about 200 nm or from about 100 nm to about 150 nm. The planarity layer may be formed of a material including combinations of silicon, carbon, nitrogen, oxygen, hydrogen, multiple layers thereof, or the like. For example, the planarity layer may include silicon nitride (SiN), silicon oxide ($SiO_2$), silicon oxynitride ($SiO_xN_y$), or the like.

In some embodiments, a selectivity layer may be disposed between the target layer 102 and the reflective film stack 104. The selectivity layer may be provided to improve etch selectivity between the reflective film stack 104 and the target layer 102. The selectivity layer may be deposited by chemical vapor deposition (CVD), atomic layer deposition (ALD), or the like. The selectivity layer may have a thickness from about 5 nm to about 60 nm or from about 30 nm to about 40 nm. The selectivity layer may be formed of a material including aluminum, tungsten, hafnium, zirconium, silicon, carbon, nitrogen, oxygen, hydrogen, combinations or multiple layers thereof, or the like. For example, the selectivity layer may include TiN, $Al_2O_3$, or the like. A first etch selectivity between the selectivity layer and the target layer 102 may be greater than a second etch selectivity between the reflective film stack 104 and the target layer 102. For example, a ratio of the first etch selectivity to the second etch selectivity may be greater than about 2.

Figure 2:
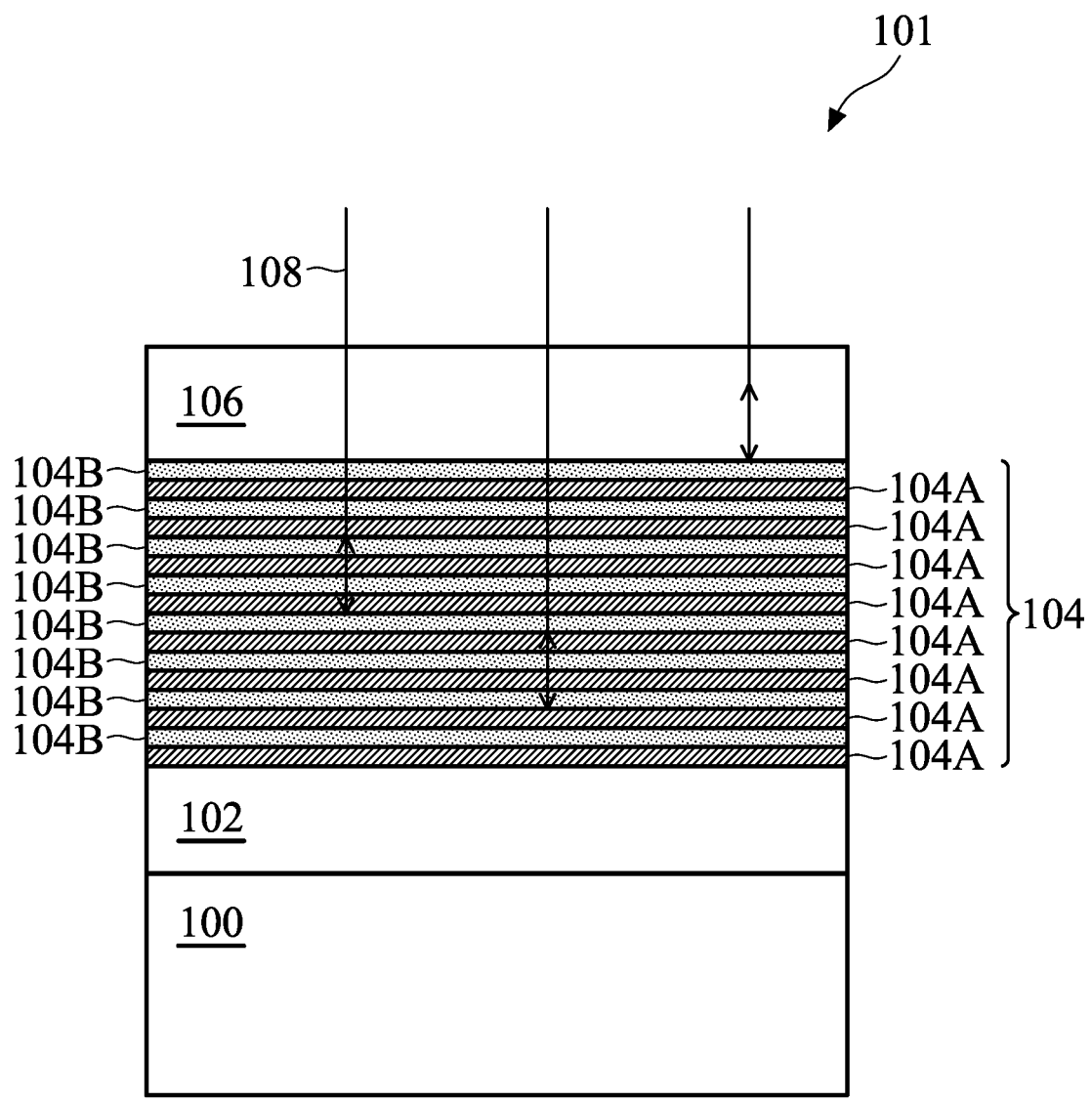
Figure 3:
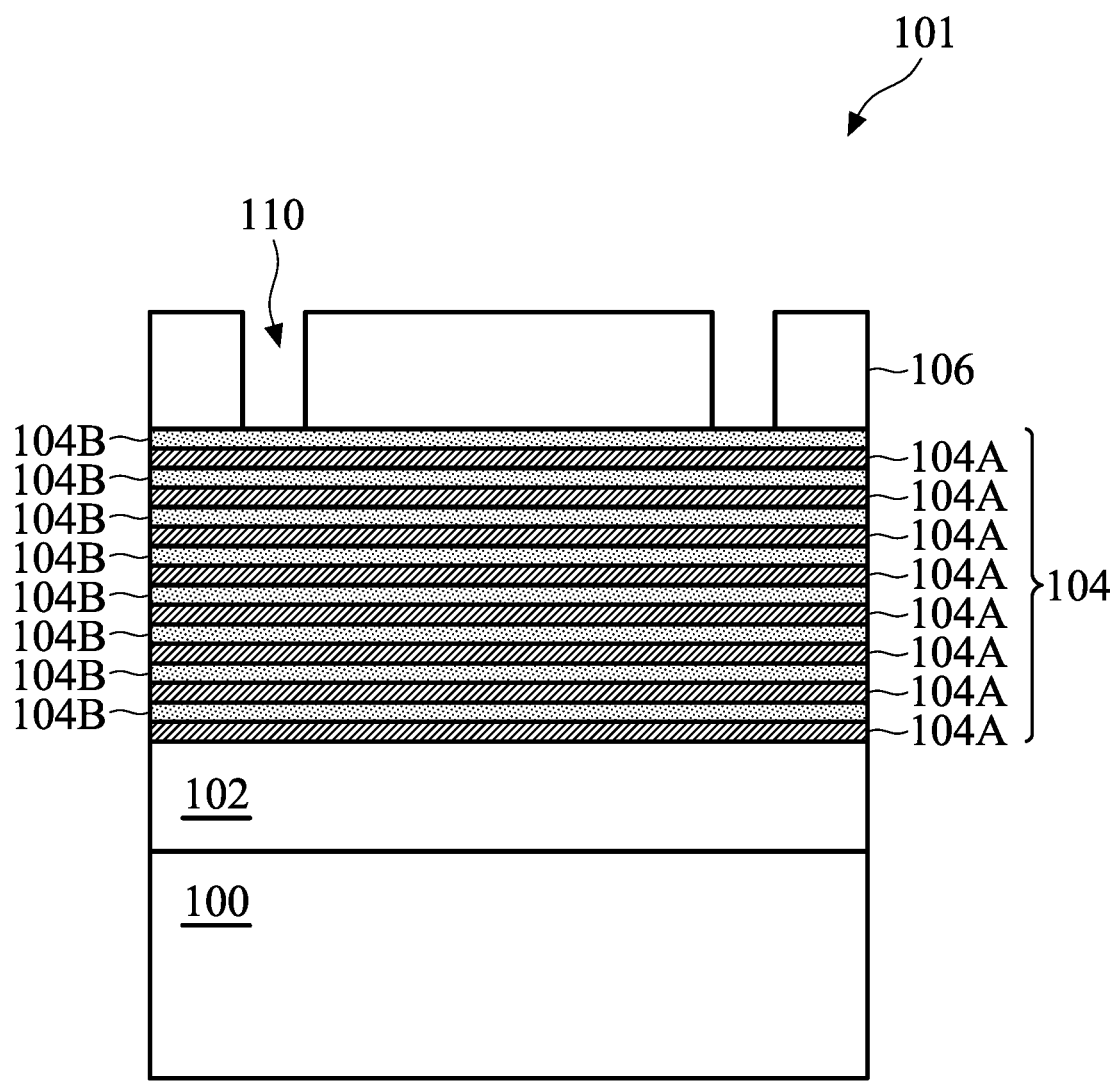

In FIGS. 2 and 3, the photosensitive layer 106 is patterned. The photosensitive layer 106 may be patterned using lithography techniques such as extreme ultraviolet (EUV) lithography, deep ultraviolet (DUV) lithography, X-ray lithography, soft X-ray (SX) lithography, ion beam projection lithography, electron-beam projection lithography, or the like. In FIG. 2, the photosensitive layer 106 is exposed to a radiation beam 108. In some embodiments, the radiation beam 108 may include EUV radiation. For example, the radiation beam 108 may include EUV radiation having wavelengths ranging from 10 nm to 125 nm. In some embodiments, the radiation beam 108 may include radiation having a wavelength of about 13.5 nm. The radiation beam 108 may be generated from a tin (Sn) plasma which radiates light of the proper wavelength and which may be laser-produced. The radiation beam 108 may be patterned prior to irradiating the photosensitive layer 106. For example, a mask having a pattern to be patterned in the target layer 102 or the inverse of the pattern may be used to pattern the radiation beam 108. The mask may be a transmissive mask, a reflective mask, or the like.

Energy from the radiation beam 108 (e.g., EUV photons) that is not absorbed by a first pass through the photosensitive layer 106 may be reflected onto a backside of the photosensitive layer 106 by the reflective film stack 104. As illustrated in FIG. 2, the radiation beam 108 may pass through one or more of the high refractive index films 104A and/or the low refractive index films 104B of the reflective film stack 104 and may be reflected by interfaces between adjacent high refractive index films 104A and low refractive index films 104B. The radiation beam 108 may be supplied with an energy dose of less than about 30 $mJ/cm^2$, from about 20 $mJ/cm^2$ to about 50 $mJ/cm^2$, or from about 30 $mJ/cm^2$ to about 40 $mJ/cm^2$. The photosensitive layer 106 may be exposed to the radiation beam for a time ranging from about 10 milliseconds to about 100 milliseconds or less than about 100 milliseconds.

Reflecting the radiation beam 108 onto the backside of the photosensitive layer 106 allows for the photosensitive layer 106 to be exposed using a radiation beam 108 having a lower dose in less time as compared to conventional methods of exposing a photosensitive layer 106. This increases throughput and reduces costs. Moreover, exposing the photosensitive layer 106 to a lower radiation dose improves line-width roughness (LWR) and line-edge roughness (LER), which improves device performance and reduces device defects.

In FIG. 3, the photosensitive layer 106 is patterned to form one or more openings 110. The photosensitive layer may be patterned by exposing the photosensitive layer 106 to a developer. The photosensitive layer 106 may be a positive tone resist or a negative tone resist. In embodiments in which the photosensitive layer 106 is a positive tone resist, portions of the photosensitive layer 106 that were exposed to the radiation beam 108 may be removed by exposing the photosensitive layer 106 to the developer. In embodiments in which the photosensitive layer 106 is a negative tone resist, portions of the photosensitive layer 106 that were not exposed to the radiation beam 108 may be removed by exposing the photosensitive layer 106 to the developer. The openings 110 may have widths from about 10 nm to about 50 nm or from about 30 nm to about 40 nm and aspect ratios (e.g., a height-to-width ratio) from about 1 to about 6.

Figure 4:
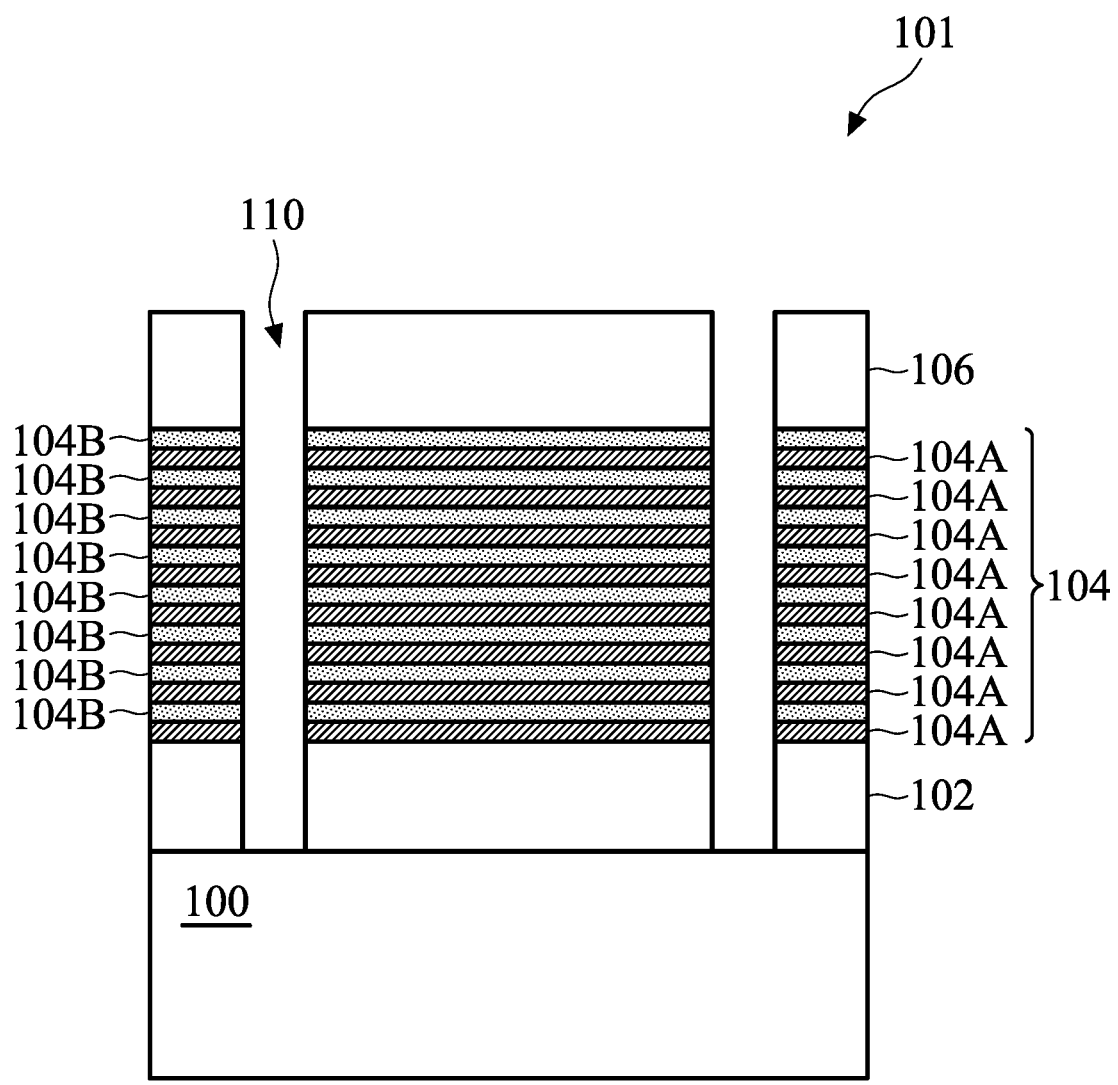

In FIG. 4, the reflective film stack 104 and the target layer 102 are etched to extend the openings 110. For example, once the photosensitive layer 106 has been patterned into the desired pattern, the photosensitive layer 106 may be used as a mask to pattern the reflective film stack 104. The pattern of the photosensitive layer 106 may be transferred to the reflective film stack 104 using an anisotropic etch process such as reactive ion etching (RIE), neutral beam etching (NBE), or the like.

Once the pattern of the photosensitive layer 106 has been transferred to the reflective film stack 104, the reflective film stack 104 may be used to transfer the pattern of the photosensitive layer 106 to the target layer 102 to form or extend the openings 110 such that the openings 110 expose top surfaces of the semiconductor substrate 100. In some embodiments, the target layer 102 may be etched using an etching process that utilizes both the photosensitive layer 106 and the reflective film stack 104 (now patterned) as masking layers. The pattern of the photosensitive layer 106 and/or the reflective film stack 104 may be transferred to the target layer 102 using an anisotropic etch process such as reactive ion etching (RIE), neutral beam etching (NBE), or the like. In some embodiments, the pattern of the photosensitive layer 106 may be transferred to the reflective film stack 104 and the target layer 102 simultaneously using a single etch process.

Figure 5:
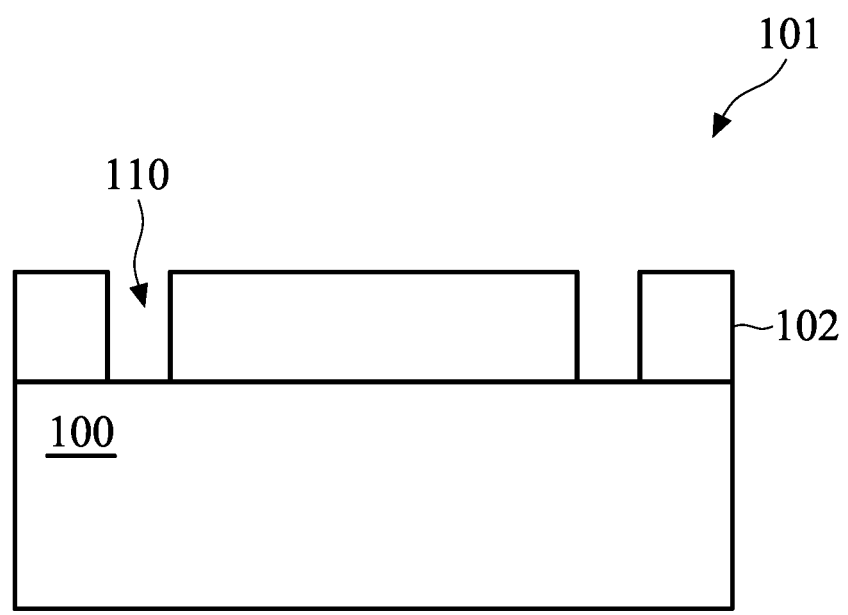

In FIG. 5, once the pattern of the photosensitive layer 106 has been transferred to the reflective film stack 104 and the target layer 102, the photosensitive layer 106 and the reflective film stack 104 are removed. In some embodiments, an ashing process may be used to remove the photosensitive layer 106 from the reflective film stack 104. In such embodiments, the temperature of the photosensitive layer 106 may be increased to cause a thermal breakdown of the photosensitive layer 106, which can then be removed using a cleaning procedure such as a rinse. In some embodiments, the photosensitive layer 106 may be removed using a wet etching process or the like. Any suitable method for removing the photosensitive layer 106 may be used.

The reflective film stack 104 may be removed using an etching process, such as a wet etching process, a dry etching process, or the like. In embodiments in which the reflective film stack 104 is removed by a dry etching process, the dry etching process may use gases including carbon tetrafluoride ($CF_4$), sulfur hexafluoride ($SF_6$), combinations thereof, or the like.

Forming the reflective film stack 104 under the photosensitive layer 106 allows for the photosensitive layer 106 to be exposed to more energy (e.g., EUV photons) from the radiation beam 108, reducing the total dose of the energy required to expose the photosensitive layer 106 and allowing the photosensitive layer 106 to be exposed in less time. This results in improved line-width roughness (LWR) and improved line-edge roughness (LER), reduces device defects, and improves device performance. Using a lower dose of energy and reducing exposure time also reduces costs and increases throughput.

In accordance with an embodiment, a method includes depositing a reflective film stack over a target layer, the reflective film stack including alternating layers of a first material and a second material, the first material having a higher refractive index than the second material; depositing a photosensitive layer over the reflective film stack; patterning the photosensitive layer to form a first opening exposing the reflective film stack, patterning the photosensitive layer including exposing the photosensitive layer to a patterned energy source, the reflective film stack reflecting at least a portion of the patterned energy source to a backside of the photosensitive layer; patterning the reflective film stack through the first opening to form a second opening exposing the target layer; and patterning the target layer through the second opening. In an embodiment, a ratio of a refractive index of the first material to a refractive index of the second material is from 1.05 to 1.10. In an embodiment, a ratio of a thickness of a layer of the first material to a thickness of a layer of the second material is from 1:1 to 3:2. In an embodiment, the reflective film stack includes from 35 to 45 pairs of layers of the first material and the second material. In an embodiment, the patterned energy source includes extreme ultraviolet (EUV) radiation. In an embodiment, a dose of the patterned energy source is less than 30 $mJ/cm^2$. In an embodiment, the photosensitive layer is exposed to the patterned energy source for less than 100 milliseconds.

In accordance with another embodiment, a method includes forming a multi-layer photoresist, forming the multi-layer photoresist including forming a reflective film stack including alternating layers of a first reflective material and a second reflective material, a ratio of a refractive index of the first reflective material to a refractive index of the second reflective material being from 1.05 to 1.10; and forming a photosensitive layer over the alternating layers of the reflective film stack; patterning the photosensitive layer and the reflective film stack; and patterning a target layer using the reflective film stack as a mask. In an embodiment, the second reflective material includes molybdenum (Mo). In an embodiment, the first reflective material includes silicon (Si). In an embodiment, the first reflective material includes beryllium (Be). In an embodiment, a ratio of thicknesses of the layers of the first reflective material to thicknesses of the layers of the second reflective material is from 1:1 to 3:2. In an embodiment, patterning the photosensitive layer includes exposing the photosensitive layer to a radiation beam including patterned extreme ultraviolet radiation. In an embodiment, the reflective film stack includes from 35 to 45 pairs of the first reflective material and the second reflective material. In an embodiment, the radiation beam is reflected at an interface between the first reflective material and the second reflective material.

In accordance with yet another embodiment, a method includes forming a reflective film stack including alternating layers of a first material and a second material different from the first material; exposing a front side of a photosensitive layer to a radiation beam, the radiation beam including extreme ultraviolet (EUV) radiation, a portion of the radiation beam being reflected from an interface between the first material and the second material of the reflective film stack to a backside of the photosensitive layer; exposing the photosensitive layer to a developer to remove a portion of the photosensitive layer exposing the reflective film stack; etching the reflective film stack using the photosensitive layer as a mask; and etching a target layer underlying the reflective film stack using the reflective film stack as a mask, the target layer including a semiconductor material, a conductive layer, or a dielectric layer. In an embodiment, the method further includes depositing a planarity layer over the target layer; and planarizing the planarity layer using a chemical mechanical planarization (CMP) process, the reflective film stack being formed over the planarity layer, and the target layer including a non-planar top surface. In an embodiment, the method further includes exposing the reflective film stack to an adhesion promoter, the adhesion promoter including hexamethyldisilazane (HMDS). In an embodiment, the reflective film stack is formed directly on the target layer. In an embodiment, the method further includes forming an etch selectivity layer over the target layer, the reflective film stack being formed over the etch selectivity layer, an etch selectivity between the etch selectivity layer and the target layer being greater than an etch selectivity between the reflective film stack and the target layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   depositing a reflective film stack over a target layer, the reflective film stack comprising alternating layers of a first material and a second material, the first material having a higher refractive index than the second material;
   depositing a photosensitive layer over the reflective film stack, wherein the photosensitive layer is deposited in direct contact with the first material or the second material;
   patterning the photosensitive layer to form a first opening exposing the reflective film stack, wherein patterning the photosensitive layer comprises exposing the photosensitive layer to a patterned energy source, wherein the reflective film stack reflects at least a portion of the patterned energy source to a backside of the photosensitive layer;
   patterning the reflective film stack through the first opening to form a second opening exposing the target layer; and
   patterning the target layer through the second opening.

2. The method of claim 1, wherein a ratio of a refractive index of the first material to a refractive index of the second material is from 1.05 to 1.10.

3. The method of claim 1, wherein a ratio of a thickness of a layer of the first material to a thickness of a layer of the second material is from 1:1 to 3:2.

4. The method of claim 1, wherein the reflective film stack comprises from 35 to 45 pairs of layers of the first material and the second material.

5. The method of claim 1, wherein the patterned energy source comprises extreme ultraviolet (EUV) radiation.

6. The method of claim 5, wherein a dose of the patterned energy source is less than 30 mJ/cm$^2$.

7. The method of claim 5, wherein the photosensitive layer is exposed to the patterned energy source for less than 100 milliseconds.

8. A method comprising:
   depositing a planarity layer over a target layer, the target layer having a non-planar top surface;
   planarizing the planarity layer using a chemical mechanical planarization (CMP) process;
   forming a multi-layer photoresist over the planarity layer and the target layer, wherein forming the multi-layer photoresist comprises:
      forming a reflective film stack comprising alternating layers of a first reflective material and a second reflective material, wherein a ratio of a refractive index of the first reflective material to a refractive index of the second reflective material is from 1.05 to 1.10; and
      forming a photosensitive layer over the alternating layers of the reflective film stack;
   patterning the photosensitive layer and the reflective film stack; and
   patterning the target layer using the reflective film stack as a mask.

9. The method of claim 8, wherein the second reflective material comprises molybdenum (Mo).

10. The method of claim 9, wherein the first reflective material comprises silicon (Si).

11. The method of claim 9, wherein the first reflective material comprises beryllium (Be).

12. The method of claim 8, wherein a ratio of thicknesses of the layers of the first reflective material to thicknesses of the layers of the second reflective material is from 1:1 to 3:2.

13. The method of claim 8, wherein patterning the photosensitive layer comprises exposing the photosensitive layer to a radiation beam comprising patterned extreme ultraviolet radiation.

14. The method of claim 13, wherein the reflective film stack comprises from 35 to 45 pairs of the first reflective material and the second reflective material.

15. The method of claim 14, wherein the radiation beam is reflected at an interface between the first reflective material and the second reflective material.

16. A method comprising:
   depositing a target layer over a semiconductor substrate, wherein the target layer is deposited with a non-planar top surface;
   planarizing the target layer;
   after planarizing the target layer, forming a reflective film stack comprising alternating layers of a first material and a second material different from the first material over the target layer;
   exposing a front side of a photosensitive layer to a radiation beam, the radiation beam comprising extreme ultraviolet (EUV) radiation, wherein a portion of the radiation beam is reflected from an interface between the first material and the second material of the reflective film stack to a backside of the photosensitive layer;
   exposing the photosensitive layer to a developer to remove a portion of the photosensitive layer exposing the reflective film stack;
   etching the reflective film stack using the photosensitive layer as a mask; and
   etching the target layer using the reflective film stack as a mask, wherein the target layer comprises a semiconductor material, a conductive layer, or a dielectric layer.

17. The method of claim 16, further comprising:
   depositing a planarity layer over the target layer; and
   planarizing the planarity layer and the target layer using a chemical mechanical planarization (CMP) process, wherein the reflective film stack is formed over the planarity layer.

18. The method of claim 16, further comprising exposing the reflective film stack to an adhesion promoter, the adhesion promoter comprising hexamethyldisilazane (HMDS).

19. The method of claim 16, wherein the reflective film stack is formed directly on the target layer.

20. The method of claim 16, further comprising forming an etch selectivity layer over the target layer, wherein the reflective film stack is formed over the etch selectivity layer, wherein an etch selectivity between the etch selectivity layer and the target layer is greater than an etch selectivity between the reflective film stack and the target layer.

* * * * *